United States Patent
Kusano et al.

(10) Patent No.: US 10,337,697 B2
(45) Date of Patent: Jul. 2, 2019

(54) INDOOR LIGHT SOURCE AND ILLUMINATION APPARATUS

(71) Applicant: KYOCERA Corporation, Kyoto-shi, Kyoto (JP)

(72) Inventors: Tamio Kusano, Higashiomi (JP); Daisuke Sakumoto, Omihachiman (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 15/764,135

(22) PCT Filed: Oct. 20, 2016

(86) PCT No.: PCT/JP2016/081134
§ 371 (c)(1),
(2) Date: Mar. 28, 2018

(87) PCT Pub. No.: WO2017/069206
PCT Pub. Date: Apr. 27, 2017

(65) Prior Publication Data
US 2018/0274754 A1    Sep. 27, 2018

(30) Foreign Application Priority Data

Oct. 20, 2015  (JP) ................................ 2015-206120

(51) Int. Cl.
*F21V 9/30*  (2018.01)
*F21S 2/00*  (2016.01)
(Continued)

(52) U.S. Cl.
CPC ................. *F21V 9/30* (2018.02); *F21S 2/00* (2013.01); *F21S 4/20* (2016.01); *F21V 15/01* (2013.01);
(Continued)

(58) Field of Classification Search
CPC .......... F21V 9/30; F21V 15/01; H01L 33/504; H01L 33/00; H01L 33/50; F21S 4/20; F21S 2/00; F21Y 2115/10
See application file for complete search history.

(56) References Cited

U.S. PATENT DOCUMENTS

| | | | | |
|---|---|---|---|---|
| 7,906,904 B2* | 3/2011 | Kawae | ............... | C09K 11/7774 313/498 |
| 2004/0007961 A1* | 1/2004 | Srivastava | ......... | C09K 11/7734 313/486 |

(Continued)

FOREIGN PATENT DOCUMENTS

EP    2905818 A1    8/2015
JP    2015-126160 A    7/2015
(Continued)

OTHER PUBLICATIONS

International Search Report, PCT/JP2016/081134, dated Nov. 22, 2016, 2 pgs.

*Primary Examiner* — Elmito Breval
*Assistant Examiner* — Glenn D Zimmerman
(74) *Attorney, Agent, or Firm* — Volpe and Koenig, P.C.

(57) ABSTRACT

An indoor light source emits light having an emission spectrum including a first peak in a wavelength region of 440 to 460 nm, a second peak in a wavelength region of 540 to 560 nm, and a third peak in a wavelength region of 610 to 630 nm. When the highest one of intensities at the first peak, the second peak, and the third peak is 1 in terms of relative intensity, the emission spectrum includes a lowest light intensity of 0.7 or higher in terms of relative intensity in λ1 to λ2 in nm, and a lowest light intensity of 0.8 or higher in terms of relative intensity in λ2 to λ3 in nm, where λ1 is a peak wavelength at the first peak in nm, λ2 is a peak wavelength at the second peak in nm, and λ3 is a peak wavelength at the third peak in nm.

8 Claims, 8 Drawing Sheets

(51) Int. Cl.
*H01L 33/00* (2010.01)
*H01L 33/50* (2010.01)
*F21S 4/20* (2016.01)
*F21V 15/01* (2006.01)
*F21Y 115/10* (2016.01)

(52) U.S. Cl.
CPC ............ *H01L 33/00* (2013.01); *H01L 33/50* (2013.01); *H01L 33/504* (2013.01); *F21Y 2115/10* (2016.08)

(56) References Cited

U.S. PATENT DOCUMENTS

2008/0198573 A1* 8/2008 Justel ................ C09K 11/7706
362/84
2014/0284636 A1 9/2014 Yamakawa et al.

FOREIGN PATENT DOCUMENTS

| WO | 2013/061942 A1 | 5/2013 |
| WO | 2014/054290 A1 | 4/2014 |

\* cited by examiner

INDOOR LIGHT SOURCE AND ILLUMINATION APPARATUS

FIELD

The present invention relates to an indoor light source and an illumination apparatus for indoor use.

BACKGROUND

Illumination apparatuses including semiconductor light-emitting devices such as laser emitting diodes (LED) as light sources, instead of fluorescent or incandescent lamps, have been used indoors, or used in buildings or in houses. For example, an illumination apparatus including a light-emitting device is used as a light source for indoor visual inspection of painted surfaces of products, such as home electric appliances and automobiles.

A semiconductor light-emitting device emits light with a narrow region of wavelengths, and may only emit monochromatic light. To produce white light as illumination light, a plurality of semiconductor light-emitting devices that emit light with different wavelength regions are prepared, and a plurality of light beams with different colors emitted from such semiconductor light-emitting devices are combined to produce white light. A plurality of phosphors that emit light with different wavelength regions using excitation light with the same wavelength are prepared, and a plurality of fluorescence beams with different colors are combined into white light.

This method of combining colors allows a light source to produce white light and also light with other spectra for intended use.

The light-emitting apparatus described in Japanese Unexamined Patent Application Publication No. 2015-126160 includes two blue light-emitting devices with different peak wavelengths, a green phosphor that is excited by light emitted from the blue light-emitting device to emit green light, and a red phosphor that emits red light to improve color rendering.

BRIEF SUMMARY

An indoor light source used in an illumination apparatus for indoor use needs to emit light with high color rendering. For example, an object appears differently under white light and under sunlight. An illumination apparatus for inspection thus needs a light source with high color rendering to perform visual inspection of products under conditions similar to the actual use of the products.

An indoor light source according to one aspect of the present invention emits light having an emission spectrum including a first peak in a wavelength region of 440 to 460 nm, a second peak in a wavelength region of 540 to 560 nm, and a third peak in a wavelength region of 610 to 630 nm. When the highest one of intensities at the first peak, the second peak, and the third peak is 1 in terms of relative intensity, the emission spectrum includes a lowest light intensity of 0.7 or higher in terms of relative intensity in a wavelength region of $\lambda 1$ to $\lambda 2$ in nm, and a lowest light intensity of 0.8 or higher in terms of relative intensity in a wavelength region of $\lambda 2$ to $\lambda 3$ in nm, where $\lambda 1$ is a peak wavelength at the first peak in nm, $\lambda 2$ is a peak wavelength at the second peak in nm, and $\lambda 3$ is a peak wavelength at the third peak in nm.

An illumination apparatus according to another aspect of the present invention includes a plurality of the indoor light sources.

DETAILED DESCRIPTION

An indoor light source according to one or more embodiments of the present invention will now be described with reference to the accompanying drawings. The present invention is not limited to the embodiments described below.

Structure of Indoor Light Source

Figure 1:
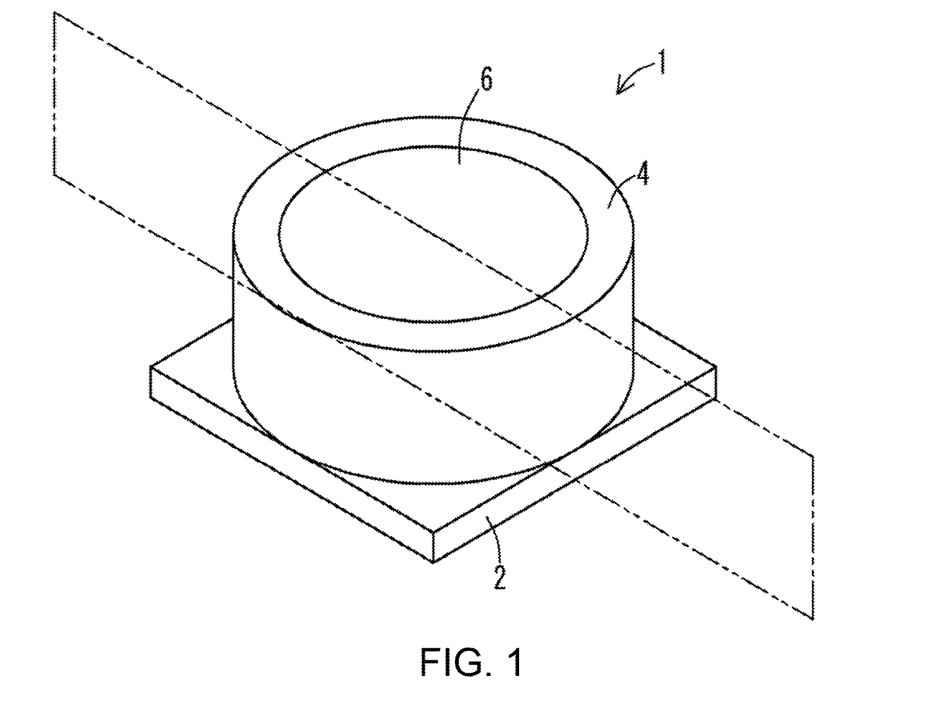
FIG. 1 is an external perspective view of an indoor light source according to one embodiment of the present invention.
Figure 2:
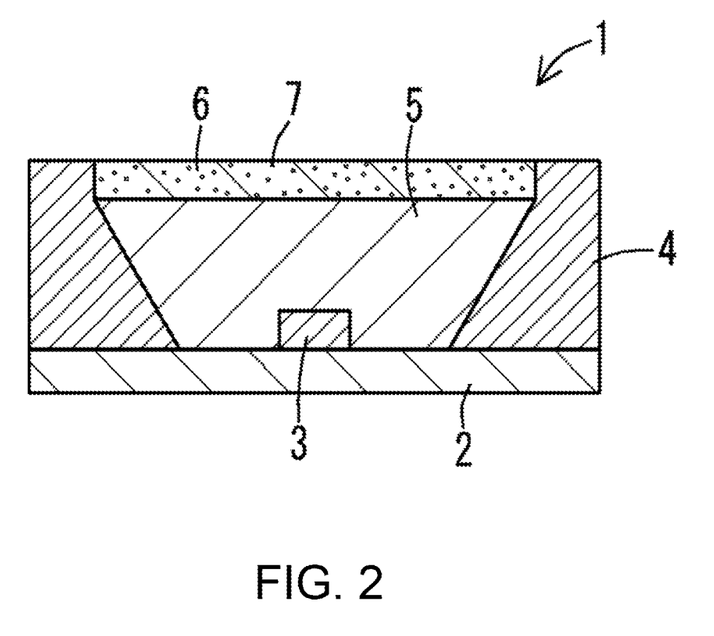
FIG. 2 is a cross-sectional view of the indoor light source taken along a plane indicated by an imaginary line shown in FIG. 1.

FIG. 1 is an external perspective view of an indoor light source according to one embodiment of the present invention. FIG. 2 is a cross-sectional view of the indoor light source taken along a plane indicated by an imaginary line shown in FIG. 1.

The indoor light source 1 includes a substrate 2, a light-emitting device 3 located on the substrate 2, a frame 4 located on the substrate 2 to surround the light-emitting device 3, a sealant 5 filling an inner space defined by the frame 4 except an upper area of the inner space defined by the frame 4, and a wavelength conversion member 6 placed on the upper surface of the sealant 5 in the upper area of the inner space defined by the frame 4 to fit inside the frame 4. The light-emitting device 3 is, for example, a light-emitting diode (LED), and emits light when electrons and holes in the p-n junction in semiconductors are recombined.

The substrate 2 is an insulating substrate, and is formed from, for example, a ceramic material such as alumina and mullite, or a glass ceramic material. In some embodiments, the substrate 2 may be formed from a composite material containing two or more of these materials. The substrate 2 may contain a polymeric resin in which metallic oxide particles are dispersed to adjust the thermal expansion of the substrate 2.

The substrate 2 has, on at least its main surface or its inside, a wiring conductor that provides electrical connection inside and outside the substrate 2. The wiring conductor is formed from, for example, a conductive material such as tungsten, molybdenum, manganese, or copper. The substrate 2 formed from a ceramic material may be prepared by, for example, applying a metal paste containing powder of, for example, tungsten containing an organic solvent in a predetermined pattern of a ceramic green sheet, which is to be the substrate 2, by printing, stacking a plurality of ceramic green sheets prepared in this manner on one another and firing the structure. This completes the substrate 2. The surface of the trace conductor is plated with, for example, nickel or gold, for preventing oxidation. The upper surface of the substrate 2 may be coated with a metallic reflective layer that is formed from, for example, aluminum, silver, gold, copper, or platina and is spaced from the wiring conductor and the plating layer to efficiently reflect light upward from the substrate 2.

The light-emitting device 3 is mounted on the main surface of the substrate 2. The light-emitting device 3 is electrically connected on the plating layer on the surface of the wiring conductor on the main surface of the substrate 2 with, for example, brazing material or solder. The light-emitting device 3 includes a translucent base and an optical semiconductor layer formed on the translucent base. The translucent base allows an optical semiconductor layer to be deposited by chemical vapor deposition, such as metal organic chemical vapor deposition or molecular beam epitaxy. The translucent base may be formed from, for example, sapphire, gallium nitride, aluminum nitride, zinc oxide, zinc selenide, silicon carbide, silicon, or zirconium boride. The translucent base has a thickness of, for example, 50 to 1000 inclusive.

The optical semiconductor layer includes a first semiconductor layer formed on the translucent base, a light-emitting layer formed on the first semiconductor layer, and a second semiconductor layer formed on the light-emitting layer. The first semiconductor layer, the light-emitting layer, and the second semiconductor layer may be formed from, for example, a group III nitride semiconductor, a group III-V semiconductor, such as gallium phosphide and gallium arsenide, or a group III nitride semiconductor, such as gallium nitride, aluminum nitride, and indium nitride. The first semiconductor layer has a thickness of, for example, 1 to 5 μm inclusive. The light-emitting layer has a thickness of, for example, 25 to 150 nm inclusive. The second semiconductor layer has a thickness of, for example, 50 to 600 nm inclusive. The light-emitting device 3 formed in this manner may emit excitation light with a wavelength range of 370 to 420 nm.

The frame 4 is formed from a resin material that is a mixture of powders of, for example, a ceramic material such as aluminum oxide, titanium oxide, zirconium oxide, or yttrium oxide, a porous material, or a metallic oxide such as aluminum oxide, titanium oxide, zirconium oxide, or yttrium oxide. The frame 4 is bonded to the main surface of the substrate 2 with, for example, a resin. The frame 4 is spaced from and surrounds the light-emitting device 3. The frame 4 has an inner sloping wall that flares away from the main surface of the substrate 2. The inner wall of the frame 4 serves as a reflection surface for reflecting excitation light emitted from the light-emitting device 3. When the inner wall of the frame 4 is circular as viewed from above, the reflection surface can reflect light emitted from the light-emitting device 3 in all directions.

The sloping inner wall of the frame 4 may have, for example, a metallic layer of tungsten, molybdenum, copper, or silver formed on the inner periphery of the frame 4 formed from a sintered material, and a plating metallic layer of nickel or gold covering the metallic layer. The plating metallic layer reflects light emitted from the light-emitting device 3. The inner wall of the frame 4 may have a slope angle of, for example, 55 to 70° inclusive with respect to the main surface of the substrate 2.

The inner space of the frame 4 is filled with the sealant 5, which transmits light. The sealant 5, which seals the light-emitting device 3, can transmit light emitted from the light-emitting device 3. The sealant 5 fills the inner space of the frame 4 except an area of the inner space defined by the frame 4. The sealant 5 may be, for example, a translucent insulating resin, such as a silicone resin, an acrylic resin, and an epoxy resin. The sealant 5 has a refractive index of, for example, 1.4 to 1.6 inclusive.

The wavelength conversion member 6 is placed on the upper surface of the sealant 5 in the upper area of the inner space defined by the frame 4. The wavelength conversion member 6 is sized to fit inside the frame 4. The wavelength conversion member 6 converts the wavelength of light emitted from the light-emitting device 3. The wavelength conversion member 6 receives light emitted from the light-emitting device 3. The light emitted from the light-emitting device 3 and incident on the wavelength conversion member 6 excites a phosphor material 7 in the wavelength conversion member 6, which then emits light. The wavelength conversion member 6 emits light by transmitting part of the light emitted from the light-emitting device 3 and the light emitted from the phosphor material 7. The wavelength conversion member 6 is formed from, for example, a translucent insulating resin, such as a fluororesin, a silicone resin, an acrylic resin, and an epoxy resin, or translucent glass. The insulating resin or the glass contains the phosphor material 7. The phosphor material 7 is uniformly dispersed in the wavelength conversion member 6.

Figure 3:
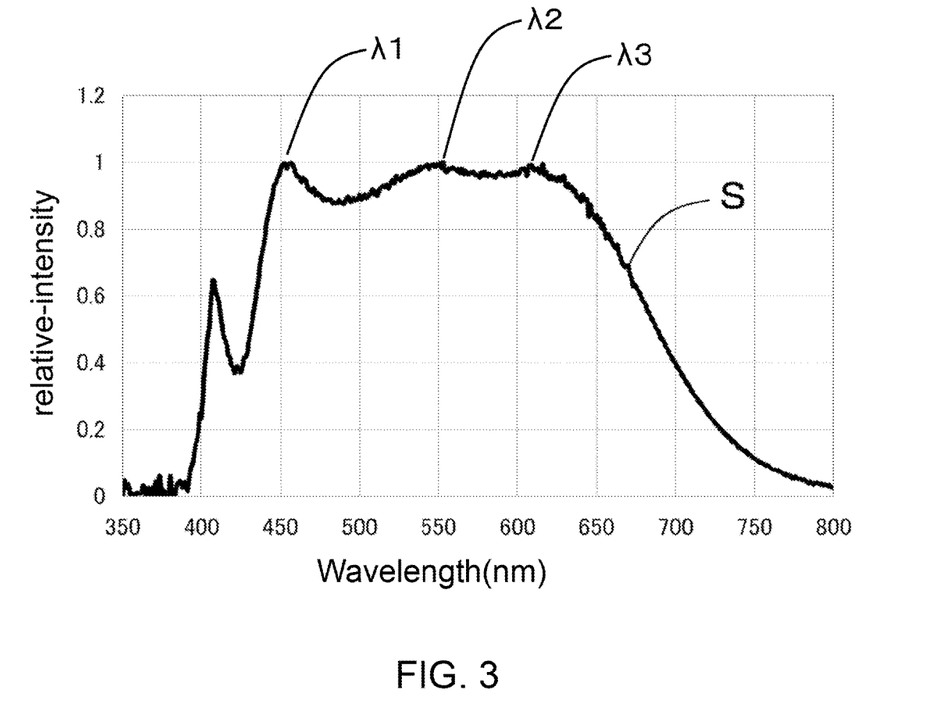
FIG. 3 is a graph showing the emission spectrum of the indoor light source according to one embodiment.

The light-emitting device 3 and the phosphor material 7 used in the wavelength conversion member 6 are selected to obtain the indoor light source 1 that emits light with an emission spectrum S shown in FIG. 3. The indoor light source 1 according to the present embodiment includes the light-emitting device 3 with a peak wavelength of 405 nm, and the phosphor material 7 including a red phosphor that shows a red fluorescence, a green phosphor that shows a green fluorescence, a first blue phosphor that shows a blue fluorescence with a first spectrum, and a second blue phosphor that shows a blue fluorescence with a second spectrum.

The fluorescence spectrum of the first blue phosphor, which is referred to as a first fluorescence spectrum, and the fluorescence spectrum of the second blue phosphor, which is referred to as a second fluorescence spectrum, have the characteristics described below. A difference between the peak wavelength $\lambda B1$ (nm) of the first fluorescence spectrum and the peak wavelength $\lambda B2$ (nm) of the second fluorescence spectrum is 10 nm or less. Although the two different blue phosphors are used in the present embodiment, the difference in the peak wavelength between the two blue phosphors is as small as 10 nm or less, and the peak wavelength $\lambda B1$ (nm) of the first fluorescence spectrum and the peak wavelength $\lambda B2$ (nm) of the second fluorescence spectrum differ from each other. The difference may be 0 nm, or in other words, the peak wavelength $\lambda B1$ may be equal to the peak wavelength $\lambda B2$. When the peak wavelength $\lambda B1$ (nm) of the first fluorescence spectrum and the peak wavelength $\lambda B2$ (nm) of the second fluorescence spectrum are different, the first fluorescence spectrum of the first blue phosphor and the second fluorescence spectrum of the second blue phosphor may be easily distinguished when the light intensities of the first blue phosphor and the second blue phosphor are determined using the emission spectrum of the indoor light source 1. This allows easy control of the light intensities of the first fluorescence spectrum of the first blue phosphor and the second fluorescence spectrum of the second blue phosphor.

A smaller difference in the peak wavelength can increase the light intensity of the blue region with the peak wavelength $\lambda B1$ (nm) of the first fluorescence spectrum and the peak wavelength $\lambda B2$ (nm) of the second fluorescence spectrum at its center. The half width of the first fluorescence spectrum, which is the fluorescence spectrum of the first blue phosphor, may differ from the half width of the second fluorescence spectrum, which is the fluorescence spectrum of the second blue phosphor. Further, the half width of the second fluorescence spectrum, which is the fluorescence spectrum of the second blue phosphor, may differ from and be greater at longer wavelengths than the half width of the first fluorescence spectrum, which is the fluorescence spectrum of the first blue phosphor.

More specifically, the half width of the first fluorescence spectrum HWB1 (nm) and the half width of the second fluorescence spectrum HWB2 (nm) differ from each other by 10 to 100 nm inclusive. The second fluorescence spectrum, which is the fluorescence spectrum of the second blue phosphor, is greater at longer wavelengths than the first fluorescence spectrum, which is the fluorescence spectrum of the first blue phosphor. In other words, the indoor light source 1 has a smaller difference in the peak wavelengths between the first blue phosphor and the second blue phosphor to increase the light intensity of the blue region, which is easily absorbed into the green phosphor, and may also combine light emitted from the first blue phosphor and the second blue phosphor with light having a wavelength of 500 to 600 nm, which is not easily absorbed into the green phosphor. The indoor light source 1 can thus reduce the difference in the light intensity between the peak wavelengths in the blue region and the green region, and increase the light intensities of the wavelengths falling between the peak wavelength in the blue region and the peak wavelength in the green region. This allows emission of light with higher color rendering having a spectrum similar to the spectrum of sunlight.

The indoor light source 1 has the emission spectrum in which $\lambda 1$ (nm) is the peak wavelength at a first peak with the highest light intensity in the blue region, $\lambda 2$ (nm) is the peak wavelength at a second peak in the green region, and $\lambda 3$ (nm) is the peak wavelength at a third peak in the red region. In this case, the two different blue phosphors allow the light intensity at the wavelength $\lambda 1$ (nm) to remain high, prevent the light intensity in the wavelength region from the wavelength $\lambda 1$ to the wavelength $\lambda 2$ (nm) from decreasing, and maintain the lowest light intensity of 0.7 or higher, or more specifically 0.85 or higher in terms of relative intensity in the wavelength region.

The red phosphor is $Y_2O_2S:Eu$, $Y_2O_3:Eu$, $SrCaClAlSiN_3:Eu^{2+}$, $CaAlSiN_3:Eu$, or $CaAlSi(ON)_3:Eu$. The green phosphor is $SrSi_2(O, Cl)_2N_2:Eu$, $(Sr, Ba, Mg)_2SiO_4:Eu^{2+}$, $ZnS:Cu, Al$, or $Zn_2SiO_4:Mn$. The first blue phosphor is $BaMgAl_{10}O_{17}:Eu$ or $(Sr, Ba)_{10}(PO_4)_6Cl_2:Eu$. The second blue phosphor is $(Sr, Ba, Ca)_5(PO_4)_3Cl:Eu$.

The indoor light source 1 used as an illumination apparatus for indoor use intends its emission spectrum that satisfies the characteristics described below. The emission spectrum includes a first peak with the highest light intensity in a wavelength region of 440 to 460 nm, a second peak in a wavelength region of 540 to 560 nm, and a third peak in a wavelength region of 610 to 630 nm, $\lambda 1$ (nm) is the peak wavelength at the first peak, $\lambda 2$ (nm) is the peak wavelength at the second peak, and $\lambda 3$ (nm) is the peak wavelength at the third peak. The highest one of the intensities at the first to third peaks is 1 in terms of relative intensity. In this case, the emission spectrum includes the lowest light intensity of 0.7 or higher in terms of relative intensity in the wavelength region of $\lambda 1$ to $\lambda 2$ (nm), and the lowest light intensity of 0.8 or higher in terms of relative intensity in the wavelength region of $\lambda 2$ to $\lambda 3$ (nm). Although the emission spectrum has no limitation in the regions of wavelengths lower than $\lambda 1$ (nm) and higher than $\lambda 3$ (nm), light with a wavelength of 380 nm or lower or 780 nm or higher in the ultraviolet region or in the infrared region is difficult to recognize as visible light, and thus is to be reduced in these regions.

The emission spectrum of the light emitted from the indoor light source 1 according to the present embodiment constantly has the light intensity of 0.7 or higher in terms of relative intensity in the wavelength region of $\lambda 1$ to $\lambda 3$ (nm), and the spectrum is more similar to the spectrum of sunlight than the emission spectrum of the light emitted from known light sources. In other words, the indoor light source 1 according to the present embodiment can emit light with higher color rendering, in addition to having a smaller difference between the highest and the lowest values of the light intensity in the wavelength region of $\lambda 1$ to $\lambda 3$ (nm).

The emission spectrum according to the present embodiment may include the lowest light intensity of 0.85 or higher in terms of relative intensity in the wavelength region of $\lambda 1$ to $\lambda 2$ (nm), and may include the lowest light intensity of 0.95 or higher in the wavelength region of $\lambda 2$ to $\lambda 3$ (nm) in terms of relative intensity.

This emission spectrum constantly includes the light intensity of 0.85 or higher in terms of relative intensity in the wavelength region of $\lambda 1$ to $\lambda 3$ (nm). The indoor light source 1 according to the present embodiment can thus emit light with higher color rendering, enabling the spectrum to be more similar to the spectrum of sunlight. In other words, this structure reduces the difference between the relative intensities in the spectrum of sunlight and in the emission spectrum of the indoor light source 1 according to the present embodiment. The resultant indoor light source 1 can produce light similar to sunlight. The emission spectrum according to the present embodiment has two of the light intensities at the first to third peaks except the highest light intensity that may be both 0.99 or higher in terms of relative intensity.

This emission spectrum has the three peak wavelengths having almost the same light intensity. This reduces the difference in the relative intensity between the spectrum of sunlight and the emission spectrum according to the present embodiment. The indoor light source 1 according to the present embodiment can thus emit light with higher color rendering, with the spectrum more similar to the spectrum of sunlight.

The emission spectrum according to the present embodiment includes the light intensity of 0.6 or higher in terms of relative intensity at 405 nm, and the light intensity of 0.4 or lower in terms of relative intensity at 400 nm. The emission spectrum may further include the light intensity of 0.8 or higher in terms of relative intensity at 650 nm, and the light intensity of 0.35 or higher in terms of relative intensity at 700 nm.

In this emission spectrum, the light intensity decreases gradually in the region of wavelengths lower than $\lambda 1$ (nm) and the region of wavelengths higher than $\lambda 3$ (nm), instead of decreasing drastically. Further, this emission spectrum reduces light in the ultraviolet region at 380 nm or lower and light in the infrared region at 780 nm or higher, which are difficult to recognize as visible light. The indoor light source 1 according to the present embodiment can thus efficiently emit light with higher color rendering, being more similar to sunlight and having reduced energy of light that is difficult to recognize as visible light.

FIG. 3 shows an example of the emission spectrum S of light emitted from the indoor light source 1 according to the present embodiment. The emission spectrum S shown in FIG. 3 is based on actual values measured in the example described below.

The emission spectrum S shown in FIG. 3 includes the peak wavelength of 452 nm at the first peak λ1 (nm), and the light intensity of 0.997 in terms of relative intensity at the peak λ1 (nm). The peak wavelength at the second peak λ2 (nm) is 553 nm, and the light intensity at λ2 (nm) is 1 in terms of relative intensity. The peak wavelength at the third peak λ3 (nm) is 616 nm, and the light intensity at λ3 (nm) is 0.994 in terms of relative intensity.

The lowest light intensity in the wavelength region of λ1 to λ2 (nm) is 0.877 in terms of relative intensity. The lowest light intensity in the wavelength region of λ2 to λ3 (nm) is 0.953 in terms of relative intensity. The light intensity at 650 nm is 0.842 in terms of relative intensity, and the light intensity at 700 nm is 0.399 in terms of relative intensity.

Figure 4:
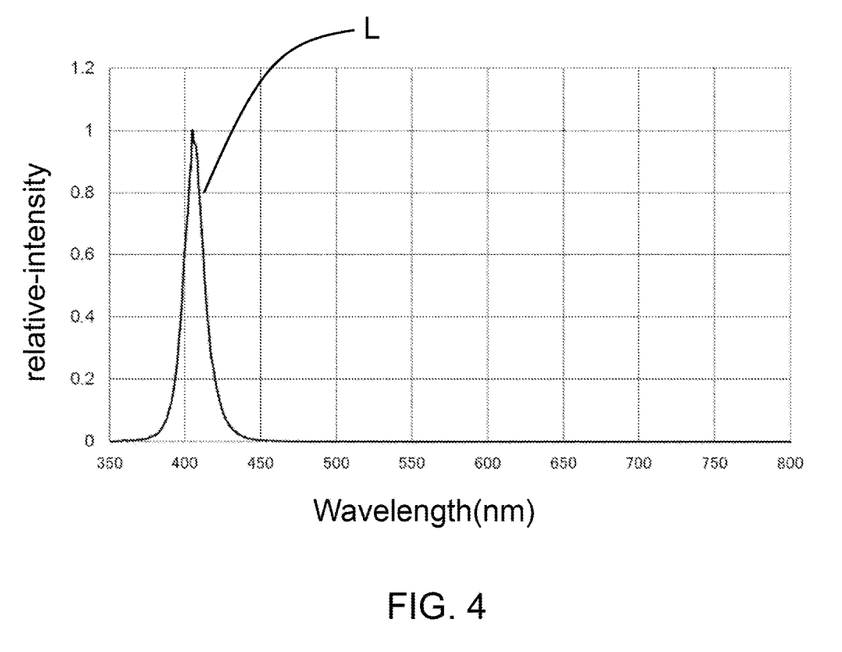
FIG. 4 is a graph showing an example of the emission spectrum of excitation light emitted from a light-emitting device 3 included in an indoor light source 1 according to the embodiment.
Figure 5:
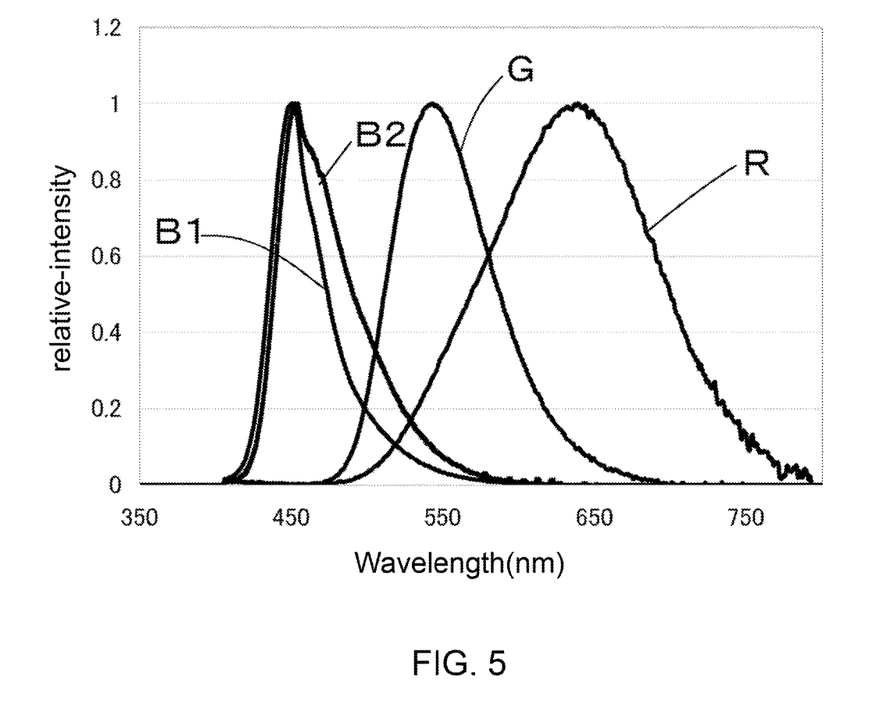
FIG. 5 is a graph showing examples of the fluorescence spectra of a red phosphor, a green phosphor, a first blue phosphor, and a second blue phosphor included in a phosphor material 7 used for the indoor light source 1 according to the embodiment.

FIG. 4 shows an example of an emission spectrum L of excitation light emitted from the light-emitting device 3 included in the indoor light source 1 according to the present embodiment. FIG. 5 shows examples of a fluorescence spectrum R of a red phosphor, a fluorescence spectrum G of a green phosphor, a first fluorescence spectrum B1 of a first blue phosphor, and a second fluorescence spectrum B2 of a second blue phosphor included in the phosphor material 7 used in the indoor light source 1 according to the present embodiment. These spectra are shown in terms of relative intensity based on the highest light intensity of each spectrum expressed as 1. The emission spectrum L shown in FIG. 4 and the fluorescence spectra B1, B2, and R shown in FIG. 5 are based on actual values measured in the example described later.

The fluorescence spectra B1, B2, and R shown in FIG. 5 include the peak wavelength λB1 of 450 nm in the first fluorescence spectrum B1. The peak wavelength λB2 of the second fluorescence spectrum B2 is 453 nm. The difference between the wavelengths λB1 and λB2 is 3 nm. The half width HWB1 of the first fluorescence spectrum B1 is 39 nm. The half width HWB2 of the second fluorescence spectrum B2 is 52 nm. The difference between the half widths HWB1 and HWB2 is 13 nm.

The indoor light source 1 according to the present embodiment is used in an illumination apparatus for indoor use, such as in a building or in a house. In one example, a plurality of indoor light sources 1 are arranged. In one example, an illumination apparatus for a living space including the indoor light source(s) 1 placed indoors can create a lighting environment that simulates an environment illuminated with sunlight. In another example, an illumination apparatus for visual inspection of painted products, such as automobiles, including the indoor light source(s) 1 placed indoors can create an inspection environment simulating an environment illuminated with sunlight. An illumination apparatus including the indoor light source(s) 1 according to the present embodiment will now be described with reference to the accompanying drawings.

Structure of Illumination Apparatus

Figure 6:
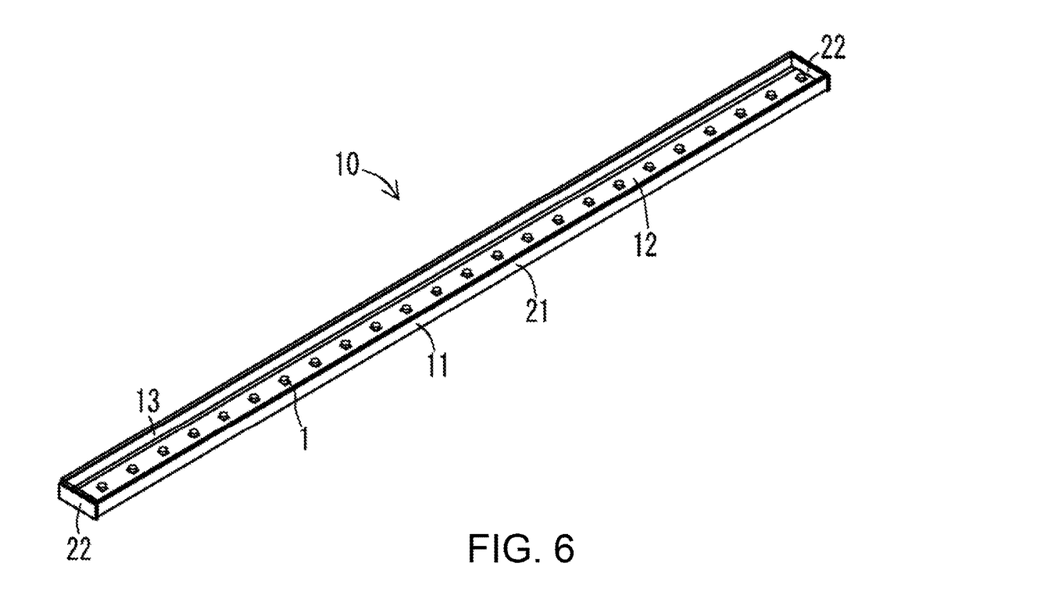
FIG. 6 is an external perspective view of an illumination apparatus including the indoor light source according to the embodiment.
Figure 7:
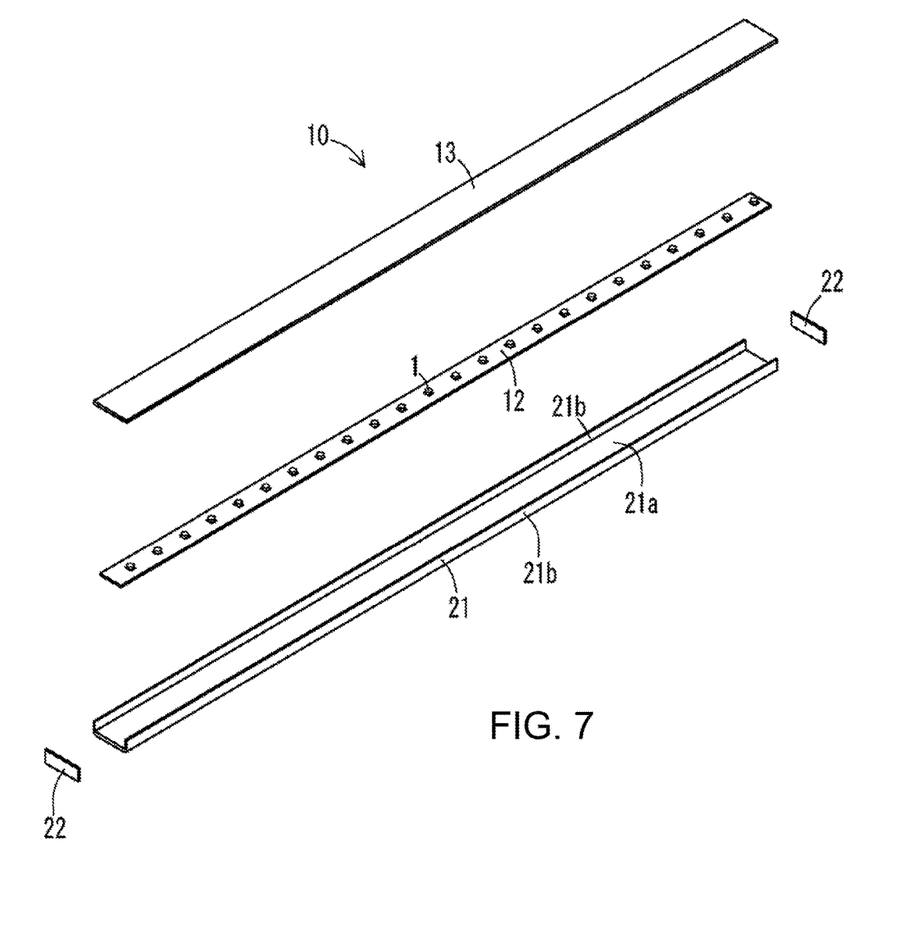
FIG. 7 is an exploded perspective view of the illumination apparatus shown in FIG. 5.
Figure 8:
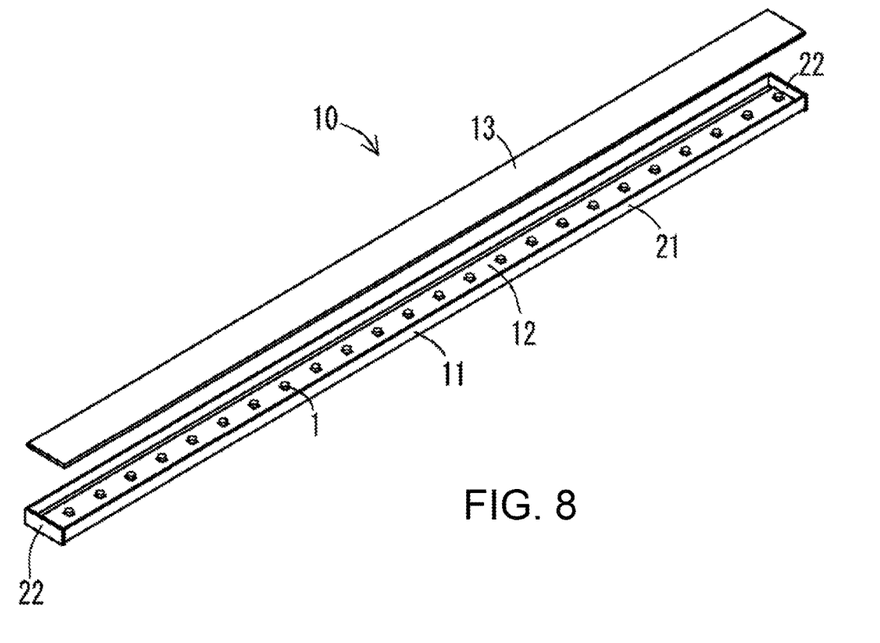
FIG. 8 is a perspective view of the illumination apparatus shown in FIG. 5 with a translucent substrate removed from a housing.

FIG. 6 is an external perspective view of an illumination apparatus including the indoor light source according to the present embodiment. FIG. 7 is an exploded perspective view of the illumination apparatus shown in FIG. 6. FIG. 8 is a perspective view of the illumination apparatus shown in FIG. 6 with a translucent substrate removed from a housing.

The illumination apparatus 10 includes a housing 11, indoor light sources 1, a wiring board 12, and a translucent substrate 13. The housing 11 is elongated and is open upward. The multiple indoor light sources 1 are arranged in line in the longitudinal direction in the housing 11. The wiring board 12 is elongated, and includes the multiple indoor light sources 1 mounted on it. The translucent substrate 13 is elongated, and is supported by the housing 11 and seals the opening of the housing 11.

The housing 11 supports the translucent substrate 13 and dissipates heat generated by the indoor light sources 1 outside. The housing 11 is formed from, for example, metal, such as aluminum, copper, or stainless steel, or plastics, or a resin. The housing 11 has a bottom 21a extending in the longitudinal direction, a pair of supports 21b extending upright from the two ends of the bottom 21a in the width direction and extending in the longitudinal direction, an elongated body 21 that is open upward and open at two ends in the longitudinal direction, and two lids 22 for sealing the open ends in the longitudinal direction of the body 21. The supports 21b each have top holders including recesses facing each other to support the translucent substrate 13. The housing 11 has a length of, for example, 100 to 2000 mm inclusive, in the longitudinal direction.

The wiring board 12 is fixed on the bottom inside the housing 11. The wiring board 12 may be, for example, a printed board such as a rigid printed board, a flexible printed board, or a rigid flexible printed board. The wiring pattern on the wiring board 12 and the wiring pattern on the substrate 2 included in each indoor light source 1 are electrically connected to each other with solder or conductive adhesive. A signal from the wiring board 12 is transmitted to the light-emitting device 3 through the substrate 2. The light-emitting device 3 then emits light. The wiring board 12 may be powered by an external power source through wiring.

The translucent substrate 13 is formed from a material that transmits light emitted from each indoor light source 1. The translucent substrate 13 may be formed from, for example, a translucent material such as an acrylic resin or glass. The translucent substrate 13 is a rectangular plate, and has a length of, for example, 98 to 1998 mm inclusive in the longitudinal direction. The translucent substrate 13 is inserted through either of the two open end of the main body 21 in the longitudinal direction along the recesses on the holders. The translucent substrate 13 is then slid in the longitudinal direction, and thus is supported by the pair of supports 21b at positions spaced from the multiple indoor light sources 1. The open ends of the main body 21 in the longitudinal direction are then covered with the lids 22. This completes the illumination apparatus 10.

The illumination apparatus 10 described above is a linear light emitting apparatus including the multiple indoor light sources 1 arranged in line. In some embodiments, the illumination apparatus 10 may be a surface light emitting apparatus including multiple indoor light sources 1 arranged in a matrix or in a staggered pattern.

Although each indoor light source 1 includes two different blue phosphors in the phosphor material 7 used in the single wavelength conversion member 6 as described above, each indoor light source 1 may include two different wavelength conversion members. In this modification, a first wavelength conversion member may include a red phosphor, a green phosphor, and a first blue phosphor, and a second wavelength conversion member may include a red phosphor, a green phosphor, and a second blue phosphor. These two different wavelength conversion members may be included in each indoor light source to combine light emitted through each wavelength conversion member. More specifically, the wavelength conversion member 6 including the first wavelength conversion member and the second wavelength conversion member stacked on each other is placed on the upper surface of the sealant 5 in an upper area of the inner space defined by the frame 4. The wavelength conversion member 6 may include multiple first wavelength conversion members and multiple second wavelength conversion members stacked on one another.

The illumination apparatus may further include two different indoor light sources. In this modification, a first indoor light source includes the above first wavelength conversion member, and a second indoor light source includes the above second wavelength conversion member. The illumination apparatus may emit light obtained by combining light emitted from the first indoor light source and light emitted from the second indoor light source.

EXAMPLES

The indoor light source 1 shown in FIGS. 1 and 2 was fabricated, and evaluated for its color rendering. The light-emitting device 3, which emits excitation light, is a gallium nitride light-emitting device that emits light with a peak wavelength of 405 nm and a half width of 15 nm, and has the emission spectrum L shown in FIG. 4.

The red phosphor is $CaAlSi(ON)_3$:Eu, and has the fluorescence spectrum R shown in FIG. 4. The green phosphor is $SrSi_2(O, Cl)_2N_2$:Eu, and has the fluorescence spectrum G shown in FIG. 4. The first blue phosphor is $(Sr, Ba)_{10}(PO_4)_6Cl_2$:Eu, and has the fluorescence spectrum B1 shown in FIG. 4. The second blue phosphor is $(Sr, Ba, Ca)_5(PO_4)_3Cl$:Eu, and has the fluorescence spectrum B2 shown in FIG. 4.

The resultant indoor light source 1 has the emission spectrum S shown in FIG. 3. The indoor light source 1 then evaluated for its color rendering with the method for evaluating color rendering of light sources defined by JIS Z8726-1990. In this test, the indoor light source 1 in the present example is used as a test light source, the chromaticity coordinates (x, y) are set to the coordinates (0.3443, 0.3558), and CIE daylight is used as a reference illuminant. Table 1 shows the measurement results of color rendering using the general color rendering index Ra and the special color rendering indexes R1 to R15 for each test color sample.

TABLE 1

| | |
|---|---|
| R1 | 97.5 |
| R2 | 99.3 |
| R3 | 99.2 |
| R4 | 97.0 |
| R5 | 97.5 |
| R6 | 98.2 |
| R7 | 96.5 |
| R8 | 92.8 |
| R9 | 81.5 |
| R10 | 97.7 |
| R11 | 97.5 |
| R12 | 93.4 |
| R13 | 98.2 |
| R14 | 99.9 |
| R15 | 96.0 |
| Ra | 97.3 |

The general color rendering index Ra (arithmetic average of R1 to R8) tends to be higher as the light is more similar to sunlight (with the highest value of 100). Thus, when the emission spectrum of the indoor light source 1 as the test light source is more similar to the spectrum of sunlight, the index Ra is higher, indicating that the color rendering is higher. In this example, the general color rendering index Ra of the indoor light source 1 as the test light source is as high as 97.3 as shown in Table 1, whereas the other special color rendering indexes R1 to R15 are also high.

As shown in this example, the indoor light source 1 emits light with the emission spectrum shown in FIG. 3 that is similar to the emission spectrum of sunlight. The resultant indoor light source 1 achieves high color rendering.

REFERENCE SIGNS LIST 1 indoor light source
2 substrate
3 light-emitting device
4 frame
5 sealant
6 wavelength conversion member
7 phosphor
10 illumination apparatus

The invention claimed is:

1. An indoor light source, comprising:
a light-emitting element configured to emit ultraviolet light;
a wavelength conversion member containing a phosphor that emits light having an emission spectrum including:
a first peak in a wavelength region of 440 to 460 nm;
a second peak in a wavelength region of 540 to 560 nm;
a third peak in a wavelength region of 610 to 630 nm, wherein
a first light intensity that is the lowest in a wavelength region from $\lambda 1$ to $\lambda 2$ in nm is 70% or more with respect to the highest one of intensities at the first peak, the second peak, and the third peak, and
a second light intensity that is the lowest in a wavelength region from $\lambda 2$ to $\lambda 3$ in nm is 80% or more with respect to the highest one of the intensities, where
$\lambda 1$ is a wavelength of a peak top of the first peak in nm;
$\lambda 2$ is a wavelength of a peak top of the second peak in nm; and
$\lambda 3$ is a wavelength of a peak top of the third peak in nm;
a red phosphor that emits a red fluorescence;
a green phosphor that emits a green fluorescence;
a first blue phosphor that emits a blue fluorescence with a first fluorescence spectrum; and
a second blue phosphor that shows a blue fluorescence with a second fluorescence spectrum,
wherein a difference between a peak wavelength $\lambda B1$ in nm of the first fluorescence spectrum and a peak wavelength $\lambda B2$ in nm of the second fluorescence spectrum is 5 nm or less, and
a difference between a first half width in nm of the first fluorescence spectrum and a second half width in nm of the second fluorescence spectrum is 10 nm or more.

2. The indoor light source according to claim 1, wherein the emission spectrum includes a light intensity of 0.8 or higher in terms of relative intensity at 650 nm, and a light intensity of 0.35 or higher in terms of relative intensity at 700 nm.

3. The indoor light source according to claim 1, wherein the emission spectrum includes a lowest light intensity of 0.85 or higher in terms of relative intensity in a wavelength region of $\lambda 1$ to $\lambda 2$ in nm, and a lowest light intensity of 0.95 or higher in terms of relative intensity in a wavelength region of $\lambda 2$ to $\lambda 3$ in nm.

4. The indoor light source according to claim 1, wherein the emission spectrum includes at least two light intensities of 0.99 or higher in terms of relative intensity at each the first peak, the second peak and the third peaks excluding the highest light intensity.

5. An illumination apparatus, comprising:
a plurality of the indoor light sources according to claim 1.

6. The indoor light source according to claim 2, wherein the emission spectrum includes a lowest light intensity of 0.85 or higher in terms of relative intensity in a wavelength region of $\lambda 1$ to $\lambda 2$ in nm, and a lowest light intensity of 0.95 or higher in terms of relative intensity in a wavelength region of $\lambda 2$ to $\lambda 3$ in nm.

7. The indoor light source according to claim 2, wherein the emission spectrum includes at least two light intensities of 0.99 or higher in terms of relative intensity at each the first peak, the second peak and the third peaks excluding the highest light intensity.

8. The indoor light source according to claim 3, wherein the emission spectrum includes at least two light intensities of 0.99 or higher in terms of relative intensity at each the first peak, the second peak and the third peak excluding the highest light intensity.

\* \* \* \* \*